United States Patent
Cho et al.

(10) Patent No.: US 9,866,202 B2
(45) Date of Patent: *Jan. 9, 2018

(54) DIGITALLY CONTROLLED ATTENUATORS WITH LOW PHASE SHIFT

(71) Applicant: SKYWORKS SOLUTIONS, INC., Woburn, MA (US)

(72) Inventors: Joshua Haeseok Cho, Irvine, CA (US); Yunyoung Choi, Irvine, CA (US); Bipul Agarwal, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/408,916

(22) Filed: Jan. 18, 2017

(65) Prior Publication Data

US 2017/0126208 A1    May 4, 2017

Related U.S. Application Data

(63) Continuation of application No. 14/704,291, filed on May 5, 2015, now Pat. No. 9,584,096.

(Continued)

(51) Int. Cl.
*H03H 11/24* (2006.01)
*H04L 25/03* (2006.01)
*H03H 11/16* (2006.01)

(52) U.S. Cl.
CPC .......... *H03H 11/245* (2013.01); *H03H 11/16* (2013.01); *H04L 25/03828* (2013.01)

(58) Field of Classification Search
CPC .............................. H03H 11/245; H03H 11/16

(Continued)

(56) References Cited

U.S. PATENT DOCUMENTS 3,882,484 A    5/1975    Brokaw et al.
8,674,746 B1    3/2014    Staudinger
(Continued)

FOREIGN PATENT DOCUMENTS

CN    103427781 A    12/2013
CN    103731119 A    4/2014

OTHER PUBLICATIONS

International Search Report and Written Opinion of the International Searching Authority, issued on Aug. 19, 2015 in connection with PCT Application No. PCT/US2015/030004.

*Primary Examiner* — Stephen E Jones
*Assistant Examiner* — Scott S Outten
(74) *Attorney, Agent, or Firm* — Knobbe Martens Olson & Bear LLP

(57) ABSTRACT

Digitally controlled attenuators with low phase shift are provided herein. In certain configurations, a digitally controlled attenuator includes an attenuation circuit electrically connected between an input terminal and an output terminal, a bypass circuit electrically connected in parallel with the attenuation circuit between the input terminal and the output terminal, and a plurality of phase compensation capacitors including a first phase compensation capacitor and a second phase compensation capacitor electrically connected in series between the input terminal and the output terminal. The bypass circuit is configured to receive a mode control signal for selecting the bypass circuit to control an amount of attenuation between the input terminal and the output terminal. Additionally, the phase compensation capacitors are operable to compensate for a phase difference between a first signal path through the attenuation circuit and a second signal path through the bypass circuit.

20 Claims, 7 Drawing Sheets

Related U.S. Application Data

(60) Provisional application No. 61/991,276, filed on May 9, 2014, provisional application No. 62/055,879, filed on Sep. 26, 2014.

(58) Field of Classification Search
USPC .................................................... 333/81 R
See application file for complete search history.

(56) References Cited

U.S. PATENT DOCUMENTS

| | | | |
|---|---|---|---|
| 9,584,096 | B2 | 2/2017 | Cho et al. |
| 2003/0016093 | A1* | 1/2003 | Ludwig ............... H03H 11/245 333/81 R |
| 2008/0204143 | A1 | 8/2008 | Montemayor et al. |
| 2010/0164656 | A1 | 7/2010 | Chiu |
| 2012/0286878 | A1 | 11/2012 | Dening et al. |
| 2013/0043962 | A1 | 2/2013 | Granger-Jones |
| 2014/0002214 | A1 | 1/2014 | Bawell et al. |
| 2014/0002282 | A1 | 1/2014 | Bawell et al. |
| 2015/0326204 | A1 | 11/2015 | Cho et al. |

\* cited by examiner

DIGITALLY CONTROLLED ATTENUATORS WITH LOW PHASE SHIFT

CROSS-REFERENCE TO RELATED APPLICATIONS

This application is a continuation of U.S. patent application Ser. No. 14/704,291, filed May 5, 2015 and titled "APPARATUS AND METHODS FOR DIGITAL STEP ATTENUATORS WITH LOW PHASE SHIFT," which claims the benefit of priority under 35 U.S.C. §119(e) of U.S. Provisional Patent Application No. 62/055,879, filed Sep. 26, 2014 and titled "APPARATUS AND METHODS FOR DIGITAL STEP ATTENUATORS WITH LOW PHASE SHIFT," and of U.S. Provisional Patent Application No. 61/991,276, filed May 9, 2014 and titled "APPARATUS AND METHODS FOR DIGITAL STEP ATTENUATORS," each of which are herein incorporated by reference in their entireties.

BACKGROUND

Field

Embodiments of the invention relate to electronic systems, and in particular, to radio frequency (RF) electronics.

Description of the Related Technology

Digital step attenuators (DSAs) can be used to attenuate a radio frequency (RF) input signal to generate an attenuated RF signal having a desired gain and/or power. Thereafter, the attenuated RF signal can be used for a variety of purposes. For instance, the attenuated RF signal can serve as an input to a filter, modulator, and6/or amplifier in an RF system.

DSAs can be included in wireless devices to achieve digitally controlled attenuation of RF signals associated with a wide range of frequencies. DSAs can also be included in other RF systems as well, such as base stations. There is a need for improved DSAs for use in RF systems.

SUMMARY

In certain embodiments, the present disclosure relates to a digital step attenuator. The digital step attenuator includes a radio frequency (RF) input terminal, an RF output terminal, an attenuation control circuit, and a plurality of attenuation stages. The attenuation control circuit is configured to generate a plurality of mode control signals operable to control an amount of attenuation between the RF input terminal and the RF output terminal. Additionally, the plurality of attenuation stages are configured to receive the plurality of mode control signals, and are arranged in a cascade between the RF input terminal and the RF output terminal. The plurality of attenuation stages includes a first attenuation stage including an attenuation circuit, a bypass switching circuit, and one or more phase compensation capacitors configured to compensate for a phase difference between a first signal path through the attenuation circuit and a second signal path through the bypass switching circuit.

In some embodiments, the plurality of mode control signals includes a first mode control signal configured to operate the first attenuation stage in an attenuation mode or in a bypass mode, the first mode control signal operable to turn on the bypass switching circuit in the bypass mode and to turn off the bypass switching circuit in the attenuation mode.

According to various embodiments, the bypass switching circuit and the attenuation circuit are electrically connected in parallel with one another between an input and an output of the first attenuation stage. In numerous embodiments, the first attenuation stage further includes a shunt switching circuit, and the attenuation circuit includes a first terminal electrically connected to the input of the first attenuation stage, a second terminal electrically connected to the output of the first attenuation stage, and a third terminal electrically connected to a first voltage through the shunt switching circuit. In accordance with certain embodiments, the first mode control signal is operable to turn off the shunt switching circuit in the bypass mode and to turn on the shunt switching circuit in the attenuation mode.

In various embodiments, the attenuation circuit includes a T attenuator.

In some embodiments, the one or more phase compensation capacitors includes a first phase compensation capacitor electrically connected between the first terminal of the attenuation circuit and the third terminal of the attenuation circuit. According to various embodiments, the one or more phase compensation capacitors further includes a second phase compensation capacitor electrically connected between the second terminal of the attenuation circuit and the third terminal of the attenuation circuit.

In several embodiments, the bypass switching circuit includes a phase compensation inductor configured to further compensate for the phase difference between the first signal path and the second signal path. In various embodiments, the bypass switching circuit further includes a first bypass transistor and a second bypass transistor electrically connected in series with the phase compensation capacitor, and the phase compensation inductor is electrically connected between the first and second bypass transistors.

In a number of embodiments, each of plurality of attenuation stages includes at least one phase compensation capacitor.

In certain embodiments, the present disclosure relates to a method of digital step attenuation. The method includes receiving a radio frequency (RF) input signal as an input to a digital step attenuator and providing the RF input signal to a first attenuation stage of the digital step attenuator. The first attenuation stage includes an attenuation circuit, a bypass switching circuit, and one or more phase compensation capacitors. The method further includes controlling a mode of operation of the first attenuation stage to a bypass mode or to an attenuation mode using an attenuation control circuit. The attenuation mode is associated with a first signal path through the attenuation circuit and the bypass mode is associated with a second signal path through the bypass switching circuit. The method further includes compensating for a phase difference between the first signal path and the second signal path using the one or more phase compensation capacitors.

According to various embodiments, controlling the mode of operation of the first attenuation stage includes turning on the bypass switching circuit in the bypass mode and turning off the bypass switching circuit in the attenuation mode.

In several embodiments, the method further includes compensating for the phase difference between the first signal path and the second signal path using a phase compensation inductor of the bypass switching circuit. In a number of embodiments, the attenuation circuit includes a first terminal electrically connected to an input of the first attenuation stage, a second terminal electrically connected to an output of the first attenuation stage, and a third terminal electrically connected to a first voltage through a shunt switching circuit of the first attenuation stage, and the method further includes turning off the shunt switching circuit in the bypass mode and turning on the shunt switching circuit in the attenuation mode.

In certain embodiments, the present disclosure relates to a digital step attenuator stage. The digital step attenuator stage includes a stage input, a stage output, a bypass switching circuit electrically connected between the stage input and the stage output, an attenuation circuit, a shunt switching circuit, and one or more phase compensation capacitors. The attenuation circuit includes a first terminal electrically connected to the stage input, a second terminal electrically connected to the stage output, and a third terminal. The shunt switching circuit is electrically connected between the third terminal of the attenuation circuit and a first voltage. The one or more phase compensation capacitors include a first phase compensation capacitor electrically connected between the first terminal of the attenuation circuit and the third terminal of the attenuation circuit. The one or more phase compensation capacitors are configured to compensate for a phase difference between a first signal path from the stage input to the stage output through the attenuation circuit and a second signal path from the stage input to the stage output through the bypass switching circuit.

According to various embodiments, the attenuation circuit includes a T attenuator.

In several embodiments, the one or more phase compensation capacitors further includes a second phase compensation capacitor electrically connected between the second terminal of the attenuation circuit and the third terminal of the attenuation circuit.

In some embodiments, the bypass switching circuit includes a phase compensation inductor. In a number of embodiments, the bypass switching circuit further includes a first bypass transistor and a second bypass transistor electrically connected in series with the phase compensation capacitor, and the phase compensation inductor is electrically connected between the first and second bypass transistors.

DETAILED DESCRIPTION OF EMBODIMENTS

The headings provided herein, if any, are for convenience only and do not necessarily affect the scope or meaning of the claimed invention.

Disclosed herein are apparatus and methods for digital step attenuators (DSAs). In certain configurations, a DSA includes a plurality of DSA stages arranged in a cascade between an input terminal and an output terminal. Each of the DSA stages can be set in an attenuation mode or in a bypass mode. When a particular DSA stage operates in the attenuation mode, the DSA stage can provide attenuation between the stage's input and output. In contrast, when operating in the bypass mode, the DSA stage can pass a signal with no attenuation or with a relatively small amount of attenuation. The DSA further includes an attenuation control circuit, which can be used to control the modes of operation of the DSA stages.

The attenuation control circuit can be used to operate the DSA over a plurality of attenuation steps, which can be digitally selectable. To provide low phase shift across the range of attenuation steps, the DSA stages can include one or more phase compensation capacitors used to compensate for a phase difference between the DSA stage operating in the bypass mode and the DSA stage operating in the attenuation mode. In certain configurations, a DSA stage can include a T attenuator, and phase compensation capacitors can be positioned across various terminals of the T attenuator to provide phase compensation.

In certain configurations, a DSA stage can include two or more field effect transistors (FETs) electrically connected in series to operate as a stage bypass switch. Additionally, an inductor can be included in series with the two or more FETs to provide phase compensation. Although including the inductor can impact the bandwidth of the DSA, including the inductor can also improve phase performance by balancing a phase delay between attenuation circuitry and bypass circuitry of a DSA stage. Thus, the inductor can be used to achieve a desired trade-off between bandwidth and phase shift of the DSA.

Figure 1:
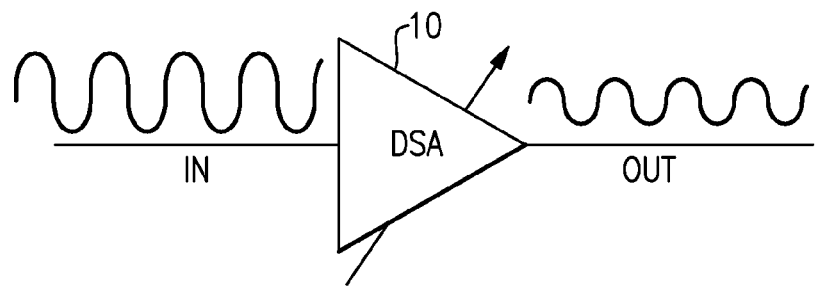
FIG. 1 is a schematic diagram of one example of a digital step attenuator (DSA).

Overview of Examples of Radio Frequency Systems that can Include One or More DSAs FIG. 1 is a schematic diagram of one example of a digital step attenuator (DSA) 10. The DSA 10 can provide a digitally selectable amount of attenuation from an input terminal IN to an output terminal OUT.

Figure 2:
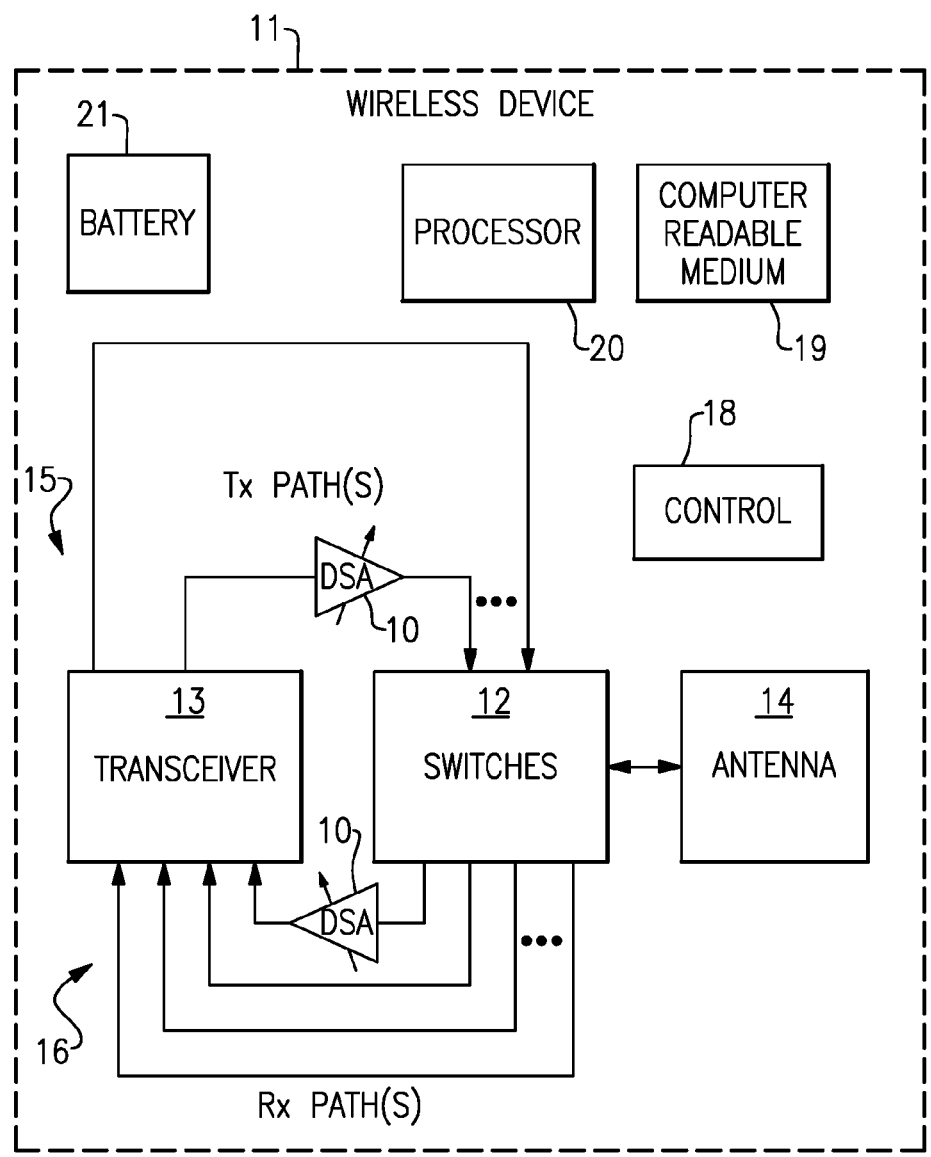
FIG. 2 is a schematic diagram of one example of a wireless device that can include one or more of the DSAs of FIG. 1.

FIG. 2 is a schematic diagram of one example of a wireless or mobile device 11 that can include one or more of the DSAs 10 of FIG. 1. The wireless device 11 can include DSAs implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx).

Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more DSAs of the present disclosure can be used to provide digitally controllable attenuation to RF signals within a mobile device implementing the foregoing example modes and/or bands, and in other communication standards. For example, 3G, 4G, LTE, and Advanced LTE are non-limiting examples of such standards.

In certain embodiments, the wireless device 11 can include DSAs 10, switches 12, a transceiver component 13, an antenna 14, a control component 18, a computer readable medium 19, a processor 20, and a battery 21.

The transceiver component 13 can generate RF signals for transmission via the antenna 14. Furthermore, the transceiver component 13 can receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two different paths shown can represent paths associated with different power outputs (e.g., low power output and high power output), and/or paths associated with different bands. Although the wireless device 11 is illustrated as including two transmission paths 15, the wireless device 11 can be adapted to include more or fewer transmission paths. As shown in FIG. 2, one or more of the transmission paths 15 can include a DSA.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the wireless device 11 is illustrated as including four receiving paths 16, the wireless device 11 can be adapted to include more or fewer receiving paths. As shown in FIG. 2, one or more of the receiving paths 16 can include a DSA.

To facilitate switching between receive and transmit paths, the switches 12 can be configured to electrically connect the antenna 14 to a selected transmit or receive path.

Thus, the switches 12 can provide a number of switching functionalities associated with operation of the wireless device 11. The switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the DSAs 10, and/or other operating component(s). Non-limiting examples of the control component 18 are described herein in greater detail.

In certain embodiments, a processor 20 can be configured to facilitate implementation of various processes described herein. In certain embodiments, computer program instructions can be stored in a computer-readable memory 19 and can direct the processor 20 or other programmable data processing apparatus to operate in a particular manner.

The battery 21 can be any suitable battery for use in the wireless device 11, including, for example, a lithium-ion battery.

The DSAs described herein can be used in the wireless device 11 of FIG. 2. For example, as shown in FIG. 2, the DSAs 10 can be used to provide attenuation in one or more of the transmission paths 15 and/or one or more of the receive paths 16.

Figure 3:
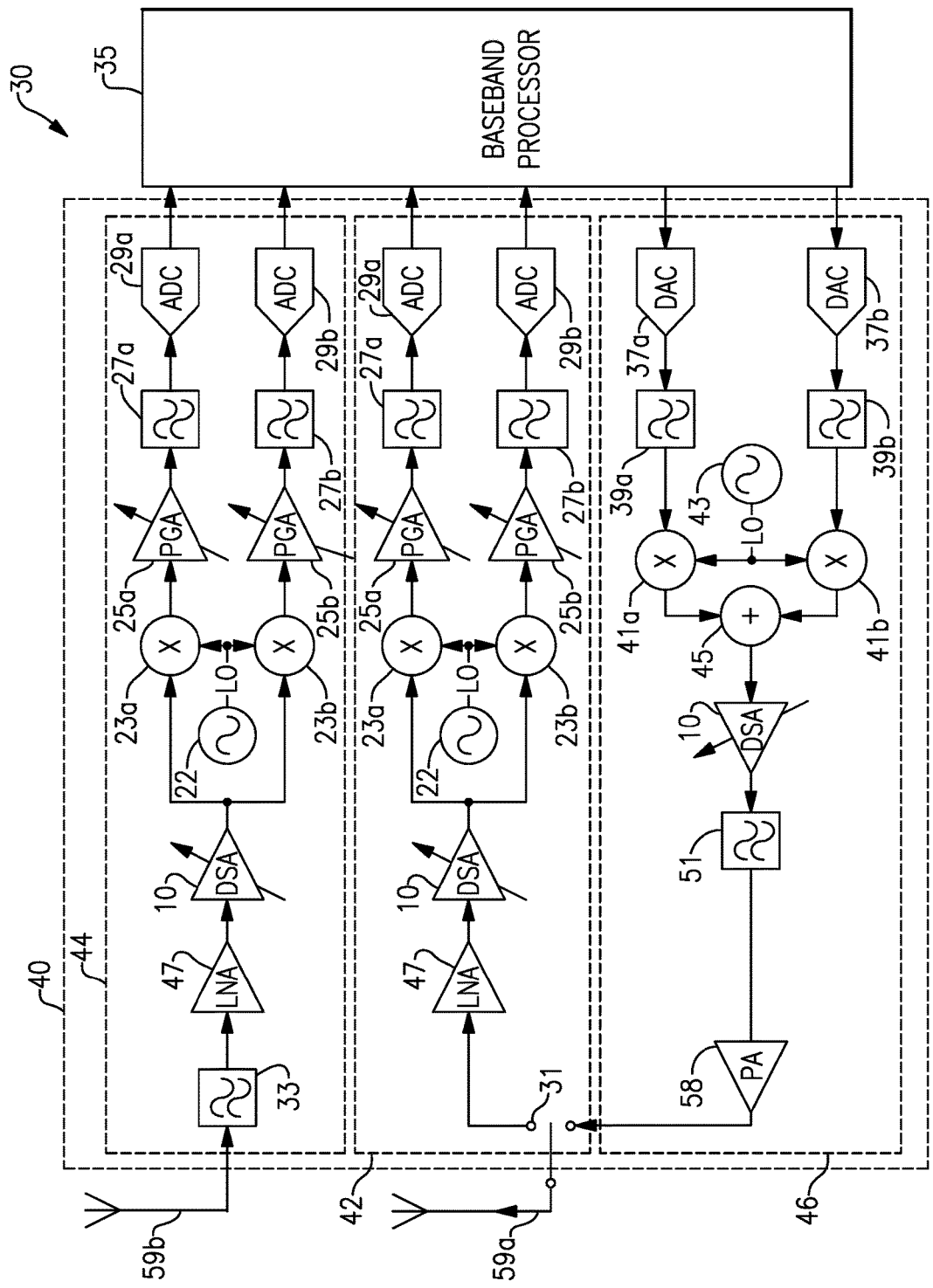
FIG. 3 is a schematic diagram of one example of a base station that can include one or more of the DSAs of FIG. 1.

FIG. 3 is a schematic diagram of one example of a base station 30 that can include one or more of the DSAs of FIG. 1. The base station 30 can include one or more DSAs implementing one or more features of the present disclosure. The illustrated base station 30 includes first and second antennas 59a, 59b, a baseband processor 35, and a transceiver component 40.

The base station 30 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), 3G, 3GPP, 4G, Enhanced Data Rates for GSM Evolution (EDGE), wireless local loop (WLL), and/or Worldwide Interoperability for Microwave Access (WiMax), as well as other proprietary and non-proprietary communications standards.

The base station 30 can include the transceiver component 40 for generating RF signals for transmission using the first antenna 59a and for receiving RF signals from the first and second antennas 59a, 59b. The illustrated transceiver component 40 includes first and second receive paths 42, 44 and a transmit path 46. Although one implementation of the base station 30 is illustrated in FIG. 3, the base station 30 can be modified in any suitable manner. For example, the transceiver component 40 can be modified to include more or fewer transmit and/or receive paths and/or more or fewer antennas.

The illustrated first receive path 42 includes a switch 31, a low noise amplifier 47, a digital step attenuator (DSA) 10, an oscillator 22, a first mixer 23a, a second mixer 23b, a first programmable gain amplifier 25a, a second programmable gain amplifier 25b, a first filter 27a, a second filter 27b, a first analog-to-digital converter 29a, and a second analog-to-digital converter 29b. The illustrated second receive path 44 includes an input filter 33, a low noise amplifier 47, a DSA 10, an oscillator 22, a first mixer 23a, a second mixer 23b, a first programmable gain amplifier 25a, a second programmable gain amplifier 25b, a first filter 27a, a second filter 27b, a first analog-to-digital converter 29a, and a second analog-to-digital converter 29b. Although one implementation of the first and second receive paths 42, 44 is illustrated in FIG. 3, the first and second receive paths can be modified to include more or fewer components and/or a different arrangement of components.

An RF signal can be received on the first and/or second antennas 59a, 59b and provided to the first and second receive paths, respectively. For example, the first receive path includes the switch 31, which can be used to electrically connected the first antenna 59a to the input of the low noise amplifier 47 of the first receive path 42. Additionally, the second antenna 59b is electrically connected to the input filter 33 so as to provide a signal received on the second antenna 59b to the input filter 33. The input filter 33 can be a low pass filter, a band pass filter, or a high pass filter, depending on the application.

The low noise amplifier 47 can include an input for receiving an RF input signal, which can have a relatively small amplitude. The low noise amplifier 47 can be configured to amplify the signal while adding or introducing a relatively small amount of noise. The low noise amplifier 47 can provide the amplified output to the DSA 10. The DSA 10 can reduce the amplitude of the low noise amplifier output without appreciably distorting features of the low noise amplifier output. For example, the DSA 10 can have a relatively high linearity and a relatively small phase shift.

The first and second mixers 23a, 23b can be configured to receive first and second local oscillator clock signals from the local oscillator 22. The first and second local oscillator clock signals can have about the same frequency and a phase difference equal to about a quarter of a period, or about 90°. The first and second mixers 23a, 23b can be configured to down convert the output of the DSA 10 using the first and second local oscillator clock signals, respectively, thereby generating first and second demodulated signals. The first and second demodulated signals can have a relative phase difference of about a quarter of a period, or about 90°, and can be used in a Q path and an I path, respectively. In certain implementations, one of the first or second oscillator clock signals is generated by phase shifting from the other.

The first and second local oscillator clock signals can each have a frequency selected so as to achieve a desired intermediate frequency and/or baseband frequency for the first and second demodulated signals. For example, multiplying the output of the DSA 10 by a sinusoidal signal from the oscillator can produce a mixed signal having a frequency content centered about the sum and difference frequencies of the carrier frequency of the DSA output signal and the frequency of the local oscillator 22.

The first and second demodulated signals can be amplified using, for example, the first and second programmable gain amplifiers 25a, 25b, respectively. To aid in reducing output noise, the outputs of the first and second programmable gain amplifiers 25a, 25b can be filtered using the first and second filters 27a, 27b, which can be any suitable filter, including, for example, low pass, band pass, or high pass filters. The outputs of the first and second filters 27a, 27b can be provided to the first and second analog-to-digital (A-to-D) converters 29a, 29b. The first and second A-to-D converters 29a, 29b can digitize an input to any suitable resolution. For example, the first and second A-to-D converters 29a, 29b can be used to generate multi-bit outputs for use by the baseband processor 35. However, in certain implementations, the first and second A-to-D converters 29a, 29b can be 1-bit analog-to-digital converters, such as limiters or saturated A-to-D converters, and the output of the converters can be one-bit digital signals. The outputs of the first and second A-to-D converters 29a, 29b can be provided to the baseband processor 35 for processing.

The baseband processor 35 can be any suitable processor configured to process a baseband signal. For instance, the baseband processor 35 can include a digital signal processor, a microprocessor, a programmable core, the like, or any combination thereof. Moreover, in some implementations, two or more baseband processors 35 can be included in the base station 30.

The transmit path 46 can receive data from the baseband processor 35 and can be used to transmit RF signals using the first antenna 59a. As illustrated in FIG. 3, the transmit path 46 and the first receive path 42 can be configured to both operate using the first antenna 59a. However, in some implementations, the transmit path 46 can transmit an RF signal using an antenna that is not shared with a receive path. The illustrated transmit path 46 includes first and second digital-to-analog (D-to-A) converters 37a, 37b, first and second filters 39a, 39b, first and second mixers 41a, 41b, a local oscillator 43, a combiner 45, a DSA 10, an output filter 51, and a power amplifier 58.

The baseband processor 35 can output a signal for a Q path and a signal for an I path. Each of these signals can be processed substantially in parallel using separate hardware until they are combined using the combiner 45. The first and second D-to-A converters 37a, 37b can each be used to convert a digital signal received from the baseband processor 35 to an analog signal. The first and second D-to-A converters 37a, 37b can have any suitable precision. The output of the first and second D-to-A converters 37a, 37b can be filtered using the first and second filters 39a, 39b, respectively. The outputs of the first and second filters 39a, 39b can be up converted using the first and second mixers 41a, 41b, respectively. For example, the first and second mixers 41a, 41b can each receive a clock signal generated using the local oscillator 43, which can be used to up convert a baseband input signal to an RF signal.

Signals from the Q path and the I path can be combined using the combiner 45 to generate a single RF signal suitable for radio frequency transmission. The output of the combiner 45 can be provided to the DSA 10. The DSA 10 can have a variable attenuation, for example, the attenuation of the DSA 10 can be controlled based on one or more control signals provided by the baseband processor 35.

The output of the DSA 10 can be filtered using the filter 51, which can be, for example, a low pass, band pass, or high pass filter configured to remove noise and/or unwanted frequency components from the signal. The output of the output filter 51 can be amplified by a power amplifier 58. In some implementations, the power amplifier 58 includes a plurality of stages cascaded to achieve a target gain. The power amplifier 58 can provide an amplified RF signal to the first antenna 59a through the switch 31.

Although FIG. 3 illustrates one example of a base station that can include one or more DSAs, the DSAs can be used in other configurations of base stations.

Apparatus and methods for digital step attenuators are provided herein. In certain configurations a digital step attenuator (DSA) includes a plurality of DSA stages arranged in a cascade between an input terminal and an output terminal. Each of the DSA stages can be set in an attenuation mode or in a bypass mode. The DSA further includes an attenuation control circuit, which can be used to control the modes of operation of the DSA stages. The attenuation control circuit can be used to set the DSA's attenuation at a particular attenuation step or level digitally selected from a plurality of attenuation steps. To provide low phase shift across the range of attenuation steps, a DSA stage can include one or more phase compensation capacitors used to compensate for a phase difference between the DSA stage operating in the bypass mode and in the attenuation mode.

Additionally, in certain configurations, a DSA stage can include two or more FETs in series to operate as a bypass switching circuit to the stage, and an inductor can be included in series with the two or more FETs to provide phase compensation. The phase compensation inductor can enhance phase performance by balancing a phase delay between attenuation circuitry and bypass circuitry of the DSA stage.

Figure 4:
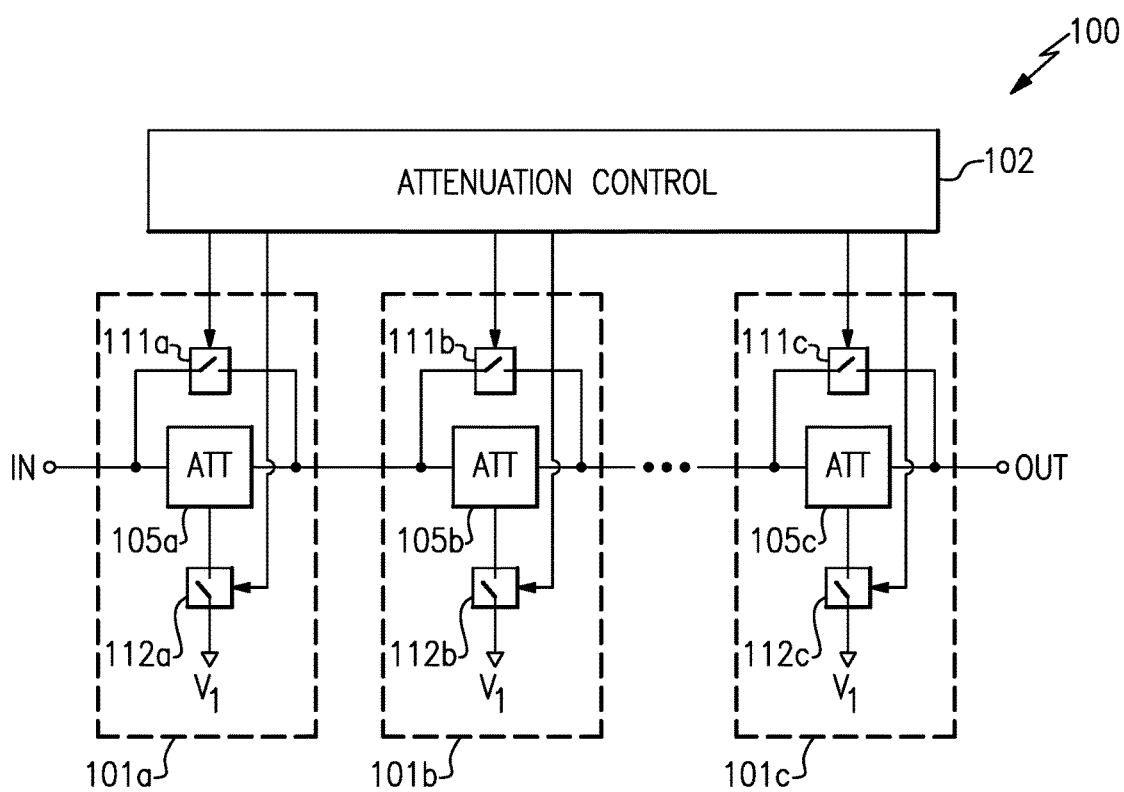
FIG. 4 is a schematic diagram of one embodiment of a DSA.

FIG. 4 is a schematic diagram of one embodiment of a DSA 100. The DSA 100 includes a first DSA stage or attenuation stage 101a, a second DSA stage 101b, a third DSA stage 101c, and an attenuation control circuit 102.

The first to third DSA stages 101a-101c are arranged in a cascade between an RF input terminal IN and an RF output terminal OUT. For example, the first DSA stage 101a includes an input electrically connected to the RF input terminal IN and an output electrically connected to an input of the second DSA stage 101b, and the third DSA stage 101c includes an input electrically connected to an output of the second DSA stage 101c and an output electrically connected to the RF output terminal OUT.

Although FIG. 4 illustrates a configuration including three DSA stages, the teachings herein are applicable to configurations using more or fewer DSA stages. In one embodiment, the DSA 100 includes between 4 and 7 stages.

The first DSA stage 101a includes a first attenuation circuit 105a, a first series or bypass switching circuit 111a, and a first shunt switching circuit 112a. The first attenuation circuit 105a includes a first terminal electrically connected to the input of the first DSA stage 101a, a second terminal electrically connected to the output of the first DSA stage 101a, and a third terminal electrically connected to a first voltage $V_1$ through the first shunt switching circuit 112a. The first bypass switching circuit 111a is electrically connected between the input and output of the first DSA stage 101a, and can be used to bypass the first attenuation circuit 105a. The second DSA stage 101b includes a second attenuation circuit 105b, a second bypass switching circuit 111b, and a second shunt switching circuit 112b, and the third DSA stage 101c includes a third attenuation circuit 105c, a third bypass switching circuit 111c, and a third shunt switching circuit 112c. Additional details of the second and third DSAs stages 101b, 101c can be similar to that of the first DSA stage 101a.

The attenuation control circuit 102 can be used to selectively open or close the first to third bypass switching circuits 111a-111c and the first to third shunt switching circuits 112a-112c to control an attenuation step or amount of the DSA 100. For example, each of the first to third DSA stages 101a-101c can be set to an attenuation mode or bypass mode by the attenuation control circuit 102. In the illustrated configuration, the attenuation control circuit 102 provides first to third bypass control signals to the first to third bypass switching circuits 111a-111c, respectively, and provides first to third shunt control signals to the first to third shunt switching circuits 112a-112c, respectively. The first to third bypass control signals and the first to third shunt control signals collectively operate as first to third mode control signals, respectively.

When a particular DSA stage operates in the attenuation mode, the stage's bypass switching circuit can be turned off or opened and the stage's shunt switching circuit can be turned on or closed, and the DSA stage's attenuation circuit can provide attenuation. Additionally, when a particular DSA stage operates in the bypass mode, the stage's bypass switching circuit can be turned on and the stage's shunt switching circuit can be turned off.

When operating in the bypass mode, the DSA stage can provide substantially no attenuation or a relatively small amount of attenuation. For example, in one embodiment, a DSA stage operating the bypass mode can provide an attenuation of less than 0.3 db.

In certain configurations, the attenuation circuits 105a-105c provide different amounts of attenuation relative to one another. For example, in one implementation, the first attenuation circuit 105a provides about twice the attenuation as the second attenuation circuit 105b, and the second attenuation circuit 105c provides about twice the attenuation as the third attenuation circuit 105c. Thus, in certain implementations, the attenuation circuits have binary weights. However, other weighing schemes are possible. Implementing the attenuation circuits to have weighted attenuation amounts can increase a range of attenuation that the DSA can provide relative to a configuration in which the attenuation circuits each provide equal amounts of attenuation.

The DSA 100 can include one or more features of the present disclosure. For example, to provide low phase shift across the range of attenuation steps, one or more of the DSA stages 101a-101c can include one or more phase compensation capacitors used to compensate for a phase difference between the DSA stage operating in the bypass mode and in the attenuation mode. Additionally, in certain implementations, one or more of the bypass switching circuits 111a-111c can include a phase compensation inductor used to enhance the DSA's phase performance by balancing a phase delay between the bypass switching circuit and a corresponding attenuation circuit.

Figure 5A:
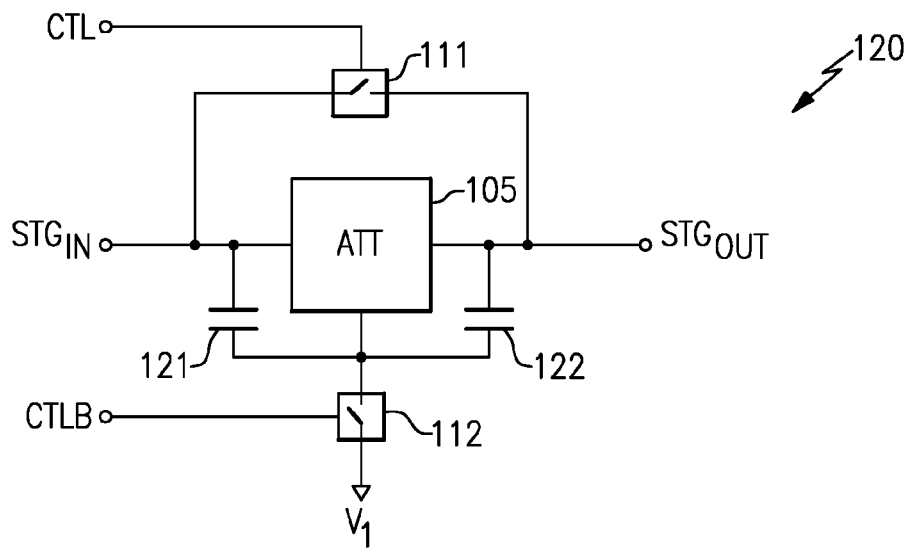
FIG. 5A is a circuit diagram of one embodiment of a DSA stage.

FIG. 5A is a circuit diagram of one embodiment of a DSA stage 120. The DSA stage 120 includes an attenuation circuit 105, a bypass switching circuit 111, a shunt switching circuit 112, a first phase compensation capacitor 121, and a second phase compensation capacitor 122. The DSA stage 120 further includes a stage input $STG_{IN}$, a stage output $STG_{OUT}$, a non-inverted mode control input CTL, and an inverted mode control input CTLB. The DSA stage 120 illustrates one embodiment of a DSA stage suitable for use as one or more stages of the DSA 100 of FIG. 4.

The attenuation circuit 105 includes a first terminal electrically connected to the stage input $STG_{IN}$, a second terminal electrically connected to the stage output $STG_{OUT}$, and a third terminal electrically connected to the first voltage $V_1$ through the shunt switching circuit 112. In certain configurations, the first voltage $V_1$ can correspond to a ground or power low supply. The attenuation circuit 105 can include a plurality of attenuation components, such as resistors and/or transistors arranged in a variety of ways. For example, in certain configurations, the attenuation circuit 105 is implemented as a T attenuator or a bridged-T attenuator.

Although FIG. 5A illustrates a configuration in which the attenuation circuit 105 includes three terminals, other configurations are possible. For example, in one embodiment, a DSA stage includes an attenuation circuit including a first terminal electrically connected to a stage input, a second terminal electrically connected to a stage output, a third terminal electrically connected to the first voltage $V_1$ through a first bypass switching circuit, and a fourth terminal electrically connected to the first voltage $V_1$ through a second bypass switching circuit. In such a configuration, the attenuation circuit can be implemented using, for example, a pi-attenuator or a bridged-pi attenuator configuration.

In the illustrated configuration, the bypass switching circuit 111 includes a switch input electrically connected to the stage input $STG_{IN}$ and to the first terminal of the attenuation circuit 105, a switch output electrically connected to the stage output $STG_{OUT}$ and to the second terminal of the attenuation circuit 105, and a control input electrically connected to the non-inverted mode control input CTL. Additionally, the shunt switching circuit 112 includes a switch input electrically connected to the third terminal of the attenuation circuit 105, a switch output electrically connected to the first voltage $V_1$, and a control input electrically connected to the inverted mode control input CTLB.

The non-inverted mode control input CTL and the inverted mode control input CTLB can be used to control a mode of operation of the DSA stage 120. For example, the non-inverted mode control input CTL can receive a non-inverted version of a mode control signal, and the inverted mode control input CTL an inverted version of the mode control signal. Additionally, when the mode control signal is logically high, the bypass switching circuit 111 can be turned on and the shunt switching circuit 112 can be turned off to operate the DSA stage 120 in a bypass mode. Furthermore, when the mode control signal is logically low, the bypass switching circuit 111 can be can be turned off and the shunt switching circuit 112 can be turned on to operate the DSA stage 120 in an attenuation mode. In certain configurations, the non-inverted mode control input CTL and the inverted mode control input CTLB can be controlled by an attenuation control circuit, such as the attenuation control circuit 102 of FIG. 4. For instance, a bypass control signal can be provided to the non-inverted mode control input CTL and a shunt control signal can be provided to the inverted mode control input CTLB.

The illustrated DSA stage 120 includes the first and second phase compensation capacitors 121, 122, which can be used to compensate for a phase difference between when the DSA stage 120 operates in the bypass mode and when the DSA stage 120 operates in the attenuation mode. For example, absent compensation, there can be a difference between a phase delay of a first signal path through attenuation circuit 105 relative to a phase delay through a second signal path through the bypass switching circuit 111.

By including phase compensation capacitors, a difference in phase between different attenuation settings of a DSA can be reduced. Thus, a DSA can operation with a small phase shift and/or phase variation across a range of attenuation steps of the DSA.

In the illustrated configuration, the first phase compensation capacitor 121 includes a first end electrically connected to the first terminal of the attenuation circuit 105 and a second end electrically connected to the third terminal of the attenuation circuit 105. Additionally, the second phase compensation capacitor 122 includes a first end electrically connected to the second terminal of the attenuation circuit 105 and a second end electrically connected to the third terminal of the attenuation circuit 105. The first and second phase compensation capacitors 121, 122 correspond to explicit capacitive structures rather than merely parasitic capacitance.

The first and second phase compensation capacitors 121, 122 can be implemented in a variety of ways, including, for example, using metal insulator metal (MIM) capacitor configurations and/or metal oxide metal (MOM) capacitor configurations. In one embodiment, when the attenuation circuit 105 provides an attenuation amount in the range of 0.25 dB to 4 dB, the first phase compensation capacitor 121 has a capacitance in the range of 0.025 pF to 0.2 pF, and the second phase compensation capacitor 122 has a capacitance in the range of 0.025 pF to 0.2 pF.

Figure 5B:
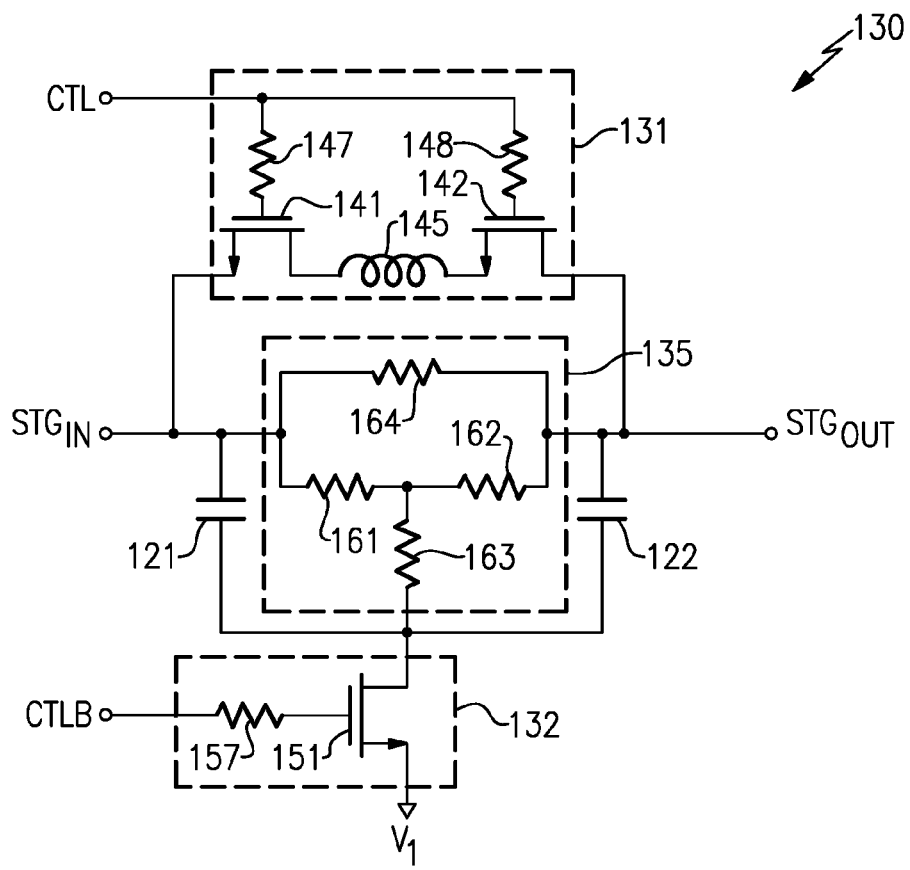
FIG. 5B is a circuit diagram of another embodiment of a DSA stage.

FIG. 5B is a circuit diagram of another embodiment of a DSA stage 130. The DSA stage 130 includes an attenuation circuit 135, a bypass switching circuit 131, a shunt switching circuit 132, a first phase compensation capacitor 121, and a second phase compensation capacitor 122. The DSA stage 130 further includes a stage input $STG_{IN}$, a stage output $STG_{OUT}$, a non-inverted mode control input CTL, and an inverted mode control input CTLB. The DSA stage 130 illustrates one embodiment of a DSA stage suitable for use as one or more stages of the DSA 100 of FIG. 4.

The attenuation circuit 135 includes a first terminal electrically connected to the stage input $STG_{IN}$, a second terminal electrically connected to the stage output $STG_{OUT}$, and a third terminal electrically connected to the first voltage $V_1$ through the shunt switching circuit 132. The attenuation circuit 135 further includes a first attenuation resistor 161, a second attenuation resistor 162, a third attenuation resistor 163, and a fourth attenuation resistor 164. The first attenuation resistor 161 includes a first end electrically connected to the attenuation circuit's first terminal and a second end electrically connected to a first end of the second attenuation resistor 162 and to a first end of the third attenuation resistor 163. The second attenuation resistor 162 further includes a second end electrically connected to the attenuation circuit's second terminal, and the third attenuation resistor 163 further includes a second end electrically connected to the attenuation circuit's third terminal. The fourth attenuation resistor 164 includes a first end electrically connected to the attenuation circuit's first terminal and a second end electrically connected to the attenuation circuit's second terminal.

The illustrated attenuation circuit 135 is implemented in a bridged-T attenuator configuration. However, other configurations are possible. For example, in another embodiment, the fourth attenuation resistor 164 is omitted such that the attenuation circuit is in a T attenuator configuration.

The illustrated shunt switching circuit 132 includes a shunt transistor 151 and a gate resistor 157. The gate resistor 157 is electrically connected between the inverted mode control input CTLB and the gate of the shunt transistor 151. The shunt transistor 151 further includes a source electrically connected to the first voltage $V_1$ and a drain electrically connected to the third terminal of the attenuation circuit 135.

The illustrated series switching circuit 131 includes a first bypass transistor 141, a second bypass transistor 142, a phase compensation inductor 145, a first gate resistor 147, and a second gate resistor 148. The first gate resistor 147 includes a first end electrically connected to the non-inverted mode control input CTL and a second end electrically connected to a gate of the first bypass transistor 141. The second gate resistor 148 includes a first end electrically connected to the non-inverted mode control input CTL and a second end electrically connected to a gate of the second bypass transistor 142. The first bypass transistor 141 further includes a source electrically connected to the stage input $STG_{IN}$ and a drain electrically connected to a first end of the phase compensation inductor 145. The second bypass transistor 142 further includes a source electrically connected to a second end of the phase compensation inductor 145 and a drain electrically connected to the stage output $STG_{OUT}$.

In the illustrated configuration, the first phase compensation capacitor 121 includes a first end electrically connected to the first terminal of the attenuation circuit 135 and a second end electrically connected to the third terminal of the attenuation circuit 135. Additionally, the second phase compensation capacitor 122 includes a first end electrically connected to the second terminal of the attenuation circuit 135 and a second end electrically connected to the third terminal of the attenuation circuit 135.

The first and second phase compensation capacitors 121, 122 can compensate for a phase difference between when the DSA stage 130 operates in the bypass mode and when the DSA stage 130 operates in the attenuation mode. In particular, the first and second phase compensation capacitors 121, 122 can aid in compensating for a difference between a phase delay of a first signal path through the attenuation circuit 135 relative to a phase delay of a second signal path through the bypass switching circuit 131.

In certain configurations, a DSA includes a plurality of DSA stages associated with different amounts of attenuation. Additionally, the phase compensation capacitors of a particular DSA stage can be scaled in relation to the amount of attenuation that the DSA stage provides. For example, when a first DSA stage provides an attenuation of $A_1$ and a second DSA stage provides an attenuation of $A_2$, a ratio of a capacitance of a phase compensation capacitor of the first DSA stage to a capacitance of a corresponding phase compensation capacitor of the second DSA stage can be selected to be about equal to $A_2/A_1$.

The illustrated bypass switching circuit 131 includes the first and second bypass field effect transistors (FETs) 141, 142, which are electrically connected in series to operate as a stage bypass switch. Additionally, the phase compensation inductor 145 has been included in series with the bypass FETs to provide phase compensation. Although including the phase compensation inductor 145 can impact bandwidth, including the phase compensation inductor 145 can also improve phase performance by balancing a phase delay between the bypass switching circuit 131 and the attenuation circuit 135. Thus, the phase compensation inductor 145 can be used to achieve a desired trade-off between bandwidth and phase shift. The phase compensation inductor 145 corresponds to an explicit inductive structure rather than merely parasitic inductance.

Figure 6A:
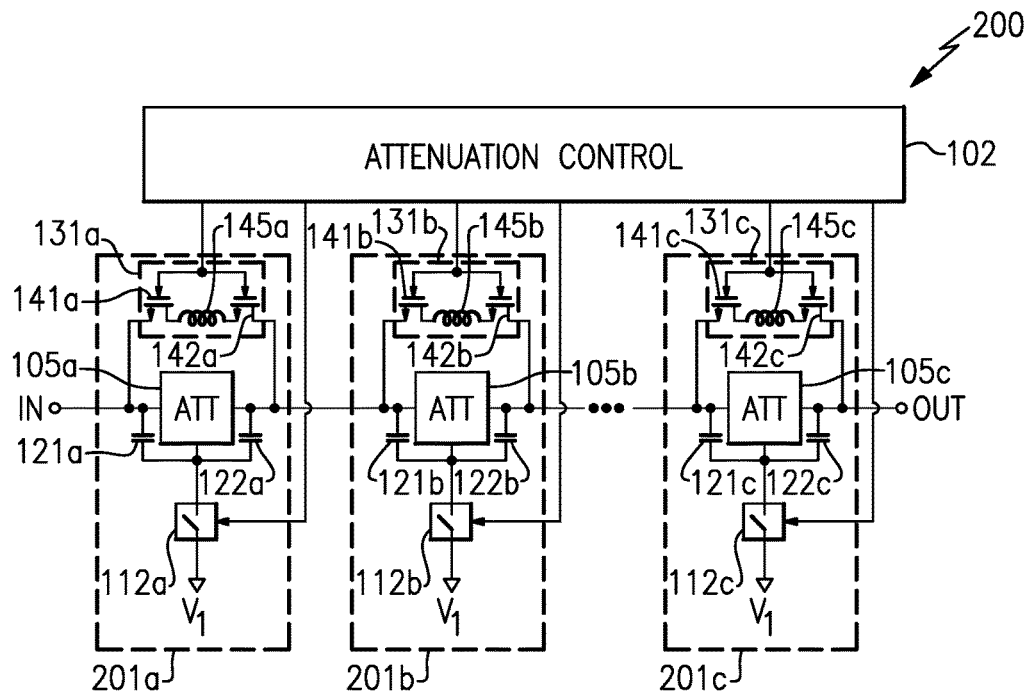
FIG. 6A is a schematic diagram of another embodiment of a DSA.

FIG. 6A is a schematic diagram of another embodiment of a DSA 200. The DSA 200 includes a first DSA stage 201a, a second DSA stage 201b, a third DSA stage 201c, and an attenuation control circuit 102. The first to third DSA stages 201a-201c are arranged in a cascade between an RF input terminal IN and an RF output terminal OUT. Although FIG. 6A illustrates a configuration including three DSA stages, the teachings herein are applicable to configurations using more or fewer DSA stages.

The first DSA stage 201a includes a first attenuation circuit 105a, a first bypass switching circuit 131a, a first shunt switching circuit 112a, and phase compensation capacitors 121a, 122a. The second DSA stage 201b includes a second attenuation circuit 105b, a second bypass switching circuit 131b, a second shunt switching circuit 112b, and phase compensation capacitors 121b, 122b. The third DSA stage 201c includes a third attenuation circuit 105c, a third bypass switching circuit 131c, a third shunt switching circuit 112c, and phase compensation capacitors 121c, 122c.

In the illustrated configuration, each of the bypass switching circuits 131a-131c includes a series combination of a first FET, a phase compensation inductor, and a second FET. For example, the first bypass switching circuit 131a includes a first FET 141a, a phase compensation inductor 145a, and a second FET 142a electrically connected in series. Additionally, the second bypass switching circuit 131b includes a first FET 141b, a phase compensation inductor 145b, and a second FET 142b electrically connected in series. Furthermore, the third bypass switching circuit 131c includes a first FET 141c, a phase compensation inductor 145c, and a second FET 142c electrically connected in series.

The phase compensation inductors 145a-145c can be used to enhance the phase performance of the DSA 200 by balancing a phase delay between attenuation circuitry and bypass circuitry of the DSA stages 201a-201c. Additional details of the DSA 200 can be similar to those described earlier.

Figure 6B:
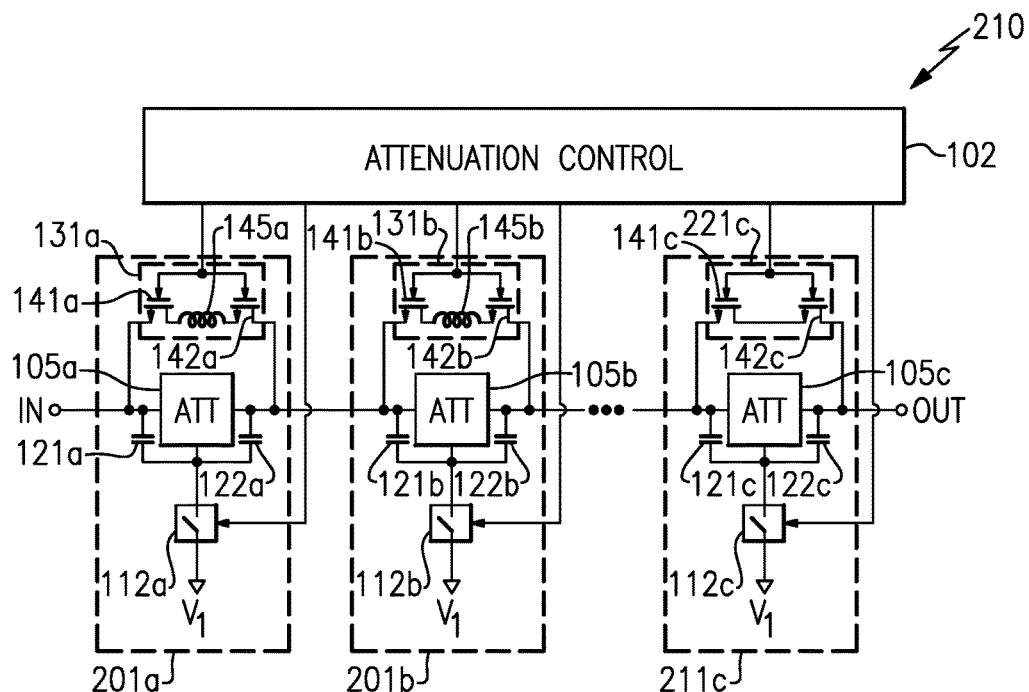
FIG. 6B is a schematic diagram of another embodiment of a DSA.

FIG. 6B is a schematic diagram of another embodiment of a DSA 210.

The DSA 210 of FIG. 6B is similar to the DSA 200 of FIG. 6A, except that the DSA 210 illustrates a different configuration of a third DSA stage 211c. The third DSA stage 211c includes the third attenuation circuit 105c, the third shunt switching circuit 112c, and the phase compensation capacitors 121c, 122c, which can be as described earlier. The third DSA stage 211c further includes a bypass switching circuit 221c that includes first and second FETs 141c, 142c. In contrast to the third bypass switching circuit 131c of FIG. 6A, the third bypass switching circuit 221c of FIG. 6B omits the phase compensation inductor 145c.

Accordingly, the DSA 210 of FIG. 6B illustrates a configuration in which a first portion of the DSA's stages include phase compensation inductors and in which a second portion of the DSA's stages omit phase compensation inductors.

In certain configurations, a phase compensation inductor can be included in less than all DSA stages of a DSA. For example, in certain configurations, the phase compensation inductor is included in stages associated with an attenuation of 1 dB or more. Including phase compensation inductors in less than all DSA stages can aid in balancing size and cost considerations associated with including the inductors with phase shift performance. Additionally, a phase compensation inductor can impact the bandwidth of a DSA, and thus including a phase compensation inductor in only certain DSA stages can aid in achieving a desired trade-off between bandwidth and phase shift performance.

Figure 7A:
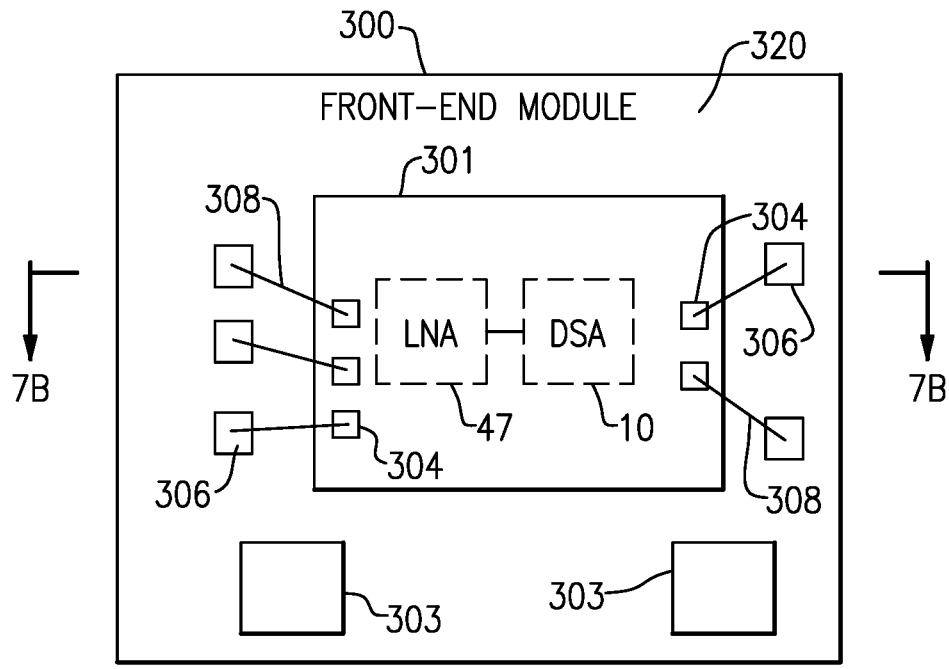
FIG. 7A is a schematic diagram of one embodiment of a radio frequency (RF) front-end module.
Figure 7B:
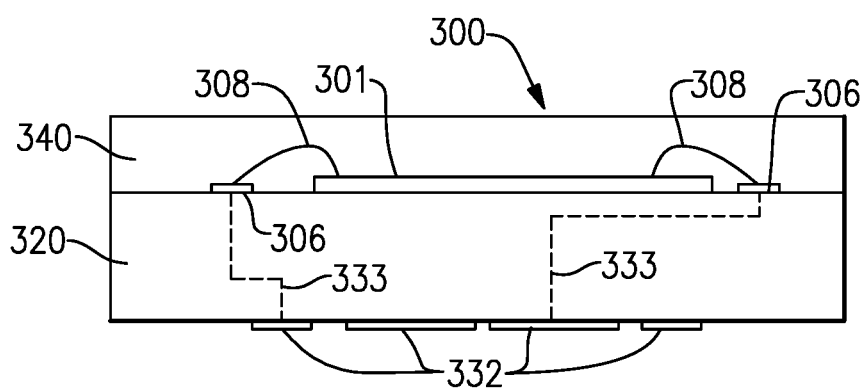
FIG. 7B is a schematic diagram of a cross-section of the RF front-end module of FIG. 7A taken along the lines 7B-7B.

FIG. 7A is a schematic diagram of one embodiment of a radio frequency (RF) front-end module 300. FIG. 7B is a schematic diagram of a cross-section of the RF front-end module 300 of FIG. 7A taken along the lines 7B-7B.

The RF front-end module 300 includes an IC or die 301, surface mount components 303, wirebonds 308, a laminated substrate 320, and encapsulation 340. The laminated substrate 320 includes pads 306 formed from conductors. Additionally, the die 301 includes pads 304, and the wirebonds 308 have been used to electrically connect the pads 304 of the die 301 to the pads 306 of the laminated substrate 301.

As illustrated in FIGS. 7A and 7B, the die 301 includes a DSA 10 and an LNA 47 formed therein. In the illustrated configuration, the DSA 10 includes an input electrically connected to an output of the LNA 47. However, other configurations are possible. The packaging substrate 320 can be configured to receive a plurality of components such as the die 301 and the surface mount components 303, which can include, for example, surface mount capacitors and/or inductors. The RF front-end module 300 corresponds to an embodiment in which the DSA is implemented as a multichip module (MCM). Although the RF front-end module 300 is illustrated as including one die, the RF front-end module 300 can be adapted to include additional dies, including, for example, dies manufactured using different processing technologies.

As shown in FIG. 7B, the RF front-end module 300 further includes contact pads 332 disposed on the side of the RF front-end module 300 opposite the side used to attach the die 301. Configuring the RF front-end module 300 in this manner can aid in connecting the RF front-end module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 7B, the electrically connections between the contact pads 332 and the die 301 can be facilitated by connections 333 through the laminated substrate 320. The connections 333 can represent electrical paths formed through the laminated substrate 320, such as connections associated with vias and conductors of multiple layers of the laminated substrate 320.

In some embodiments, the RF front-end module 300 can also include one or more packaging structures to, for example, provide protection and/or to facilitate handling of the RF front-end module 300. Such a packaging structure can include overmold or encapsulation 340 formed over the laminated substrate 320 and the components and die(s) disposed thereon.

It will be understood that although the RF front-end module 300 is described in the context of wirebond-based electrical connections, one or more features of the present disclosure can also be implemented in other packaging configurations, including, for example flip-chip configurations.

Figure 8A:
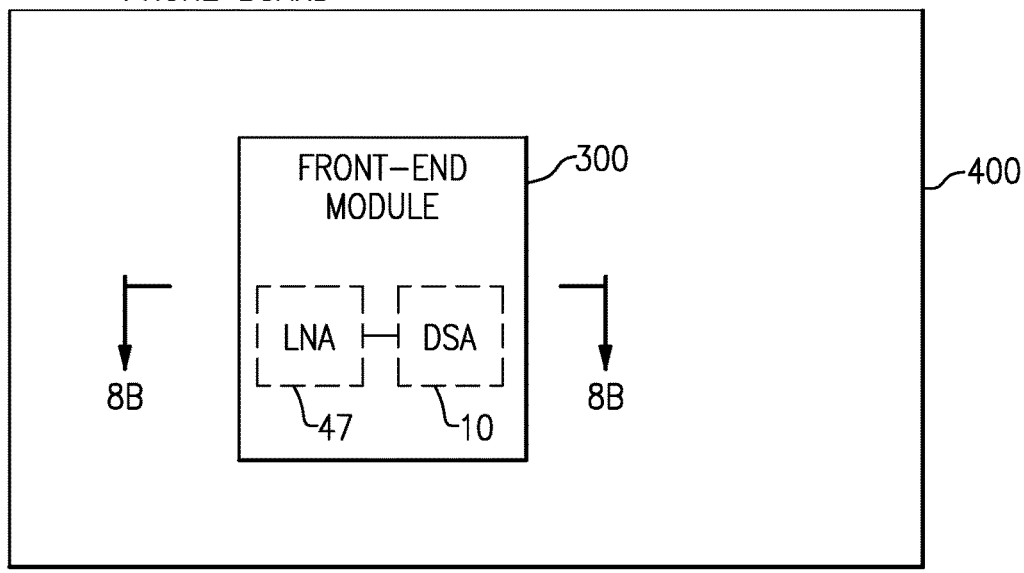
FIG. 8A is a schematic diagram of one embodiment of a phone board.
Figure 8B:
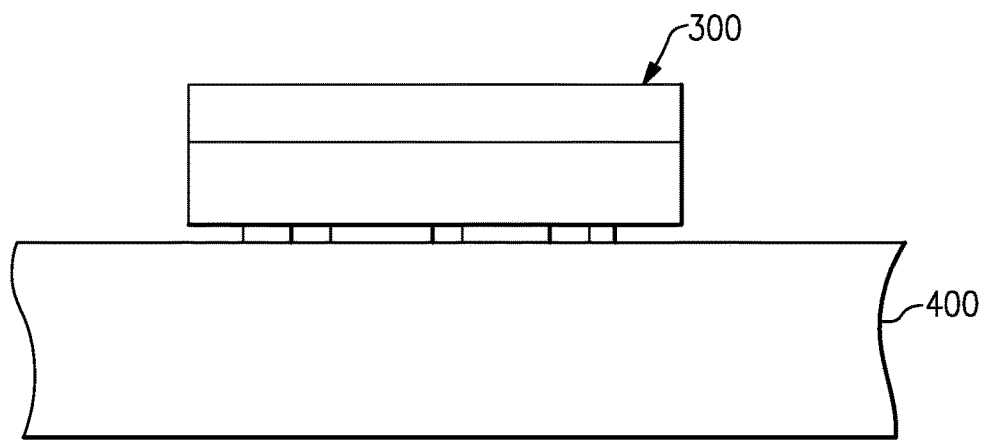
FIG. 8B is a schematic diagram of a cross-section of the phone board of FIG. 8A taken along the lines 8B-8B.

FIG. 8A is a schematic diagram of one embodiment of a phone board 400. FIG. 8B is a schematic diagram of a cross-section of the phone board 400 of FIG. 8A taken along the lines 8B-8B.

As shown in FIGS. 8A and 8B, the RF front-end module 300 has been attached to the phone board 400. Thus, the RF front-end module 300 including the DSA 10 can communicate with other electronics on the phone board 400.

Applications

Some of the embodiments described above have provided examples in connection with wireless devices and base stations. However, the principles and advantages of the embodiments can be used for any other systems or apparatus that have needs for digital step attenuation.

Digital step attenuators can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Furthermore, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A digitally controlled attenuator comprising:
an attenuation circuit electrically connected between an input terminal and an output terminal;
a bypass circuit electrically connected in parallel with the attenuation circuit between the input terminal and the output terminal, the bypass circuit configured to receive a mode control signal for selecting the bypass circuit to control an amount of attenuation between the input terminal and the output terminal; and
a plurality of phase compensation capacitors including a first phase compensation capacitor and a second phase compensation capacitor electrically connected in series between the input terminal and the output terminal, the plurality of phase compensation capacitors operable to compensate for a phase difference between a first signal path through the attenuation circuit and a second signal path through the bypass circuit.

2. The digitally controlled attenuator of claim 1 wherein the attenuation circuit includes a first resistor and a second resistor electrically connected in series between the input terminal and the output terminal, the first resistor including a first end directly connected to a first end of the first phase compensation capacitor, and the second resistor including a first end directly connected to a first end of the second phase compensation capacitor.

3. The digitally controlled attenuator of claim 2 wherein the attenuation circuit further includes a third resistor including a first end directly connected to a second end of the first resistor and to a second end of the second resistor.

4. The digitally controlled attenuator of claim 3 wherein the attenuation circuit further includes a fourth resistor including a first end directly connected to the first end of the first resistor and a second end directly connected to the first end of the second resistor.

5. The digitally controlled attenuator of claim 3 wherein the third resistor further includes a second end directly connected to a second end of the first phase compensation capacitor and to a second end of the second phase compensation capacitor.

6. The digitally controlled attenuator of claim 3 further comprising a shunt switching circuit electrically connected between a second end of the third resistor and ground, the shunt switching circuit controlled by an inverted mode control signal.

7. The digitally controlled attenuator of claim 1 wherein the bypass circuit includes a first field effect transistor and a second field effect transistor electrically connected in series and controllable by the mode control signal.

8. The digitally controlled attenuator of claim 7 wherein the bypass circuit further includes a phase compensation inductor directly connected between the first field effect transistor and the second field effect transistor.

9. A front-end module comprising:
a laminated substrate; and
an integrated circuit attached to the laminated substrate, the integrated circuit including an attenuation circuit electrically connected between an input terminal and an output terminal, a bypass circuit electrically connected in parallel with the attenuation circuit between the input terminal and the output terminal, and a plurality of phase compensation capacitors including a first phase compensation capacitor and a second phase compensation capacitor electrically connected in series between the input terminal and the output terminal, the bypass circuit configured to receive a mode control signal for selecting the bypass circuit to control an amount of attenuation between the input terminal and the output terminal, and the plurality of phase compensation capacitors operable to compensate for a phase difference between a first signal path through the attenuation circuit and a second signal path through the bypass circuit.

10. The front-end module of claim 9 wherein the attenuation circuit includes a first resistor and a second resistor electrically connected in series between the input terminal and the output terminal, the first resistor including a first end directly connected to a first end of the first phase compensation capacitor, and the second resistor including a first end directly connected to a first end of the second phase compensation capacitor.

11. The front-end module of claim 10 wherein the attenuation circuit further includes a third resistor including a first end directly connected to a second end of the first resistor and to a second end of the second resistor.

12. The front-end module of claim 11 wherein the attenuation circuit further includes a fourth resistor including a first end directly connected to the first end of the first resistor and a second end directly connected to the first end of the second resistor.

13. The front-end module of claim 11 wherein the third resistor further includes a second end directly connected to a second end of the first phase compensation capacitor and to a second end of the second phase compensation capacitor.

14. The front-end module of claim 11 wherein the attenuation circuit further includes a shunt switching circuit electrically connected between a second end of the third resistor and ground, the shunt switching circuit controlled by an inverted mode control signal.

15. The front-end module of claim 9 wherein the bypass circuit includes a first field effect transistor and a second field effect transistor electrically connected in series and controllable by the mode control signal.

16. The front-end module of claim 15 wherein the bypass circuit further includes a phase compensation inductor directly connected between the first field effect transistor and the second field effect transistor.

17. The front-end module of claim 9 wherein the integrated circuit further includes an attenuation control circuit configured to generate the mode control signal.

18. The front-end module of claim 9 wherein the integrated circuit further includes a low noise amplifier configured to provide a radio frequency signal to the input terminal.

19. A wireless device comprising:
a transceiver;
an antenna; and
a digitally controlled attenuator electrically connected in a signal path of the wireless device between the transceiver and the antenna, the digitally controlled attenuator including an attenuation circuit electrically connected between an input terminal and an output terminal, a bypass circuit electrically connected in parallel with the attenuation circuit between the input terminal and the output terminal, and a plurality of phase compensation capacitors including a first phase compensation capacitor and a second phase compensation capacitor electrically connected in series between the input terminal and the output terminal, the bypass circuit configured to receive a mode control signal for selecting the bypass circuit to control an amount of attenuation between the input terminal and the output terminal, and the plurality of phase compensation capacitors operable to compensate for a difference between a phase delay of the attenuation circuit and a phase delay of the bypass circuit.

20. The wireless device of claim 19 wherein the bypass circuit includes a first field effect transistor, a second field effect transistor, and a phase compensation inductor directly connected between the first field effect transistor and the second field effect transistor.

* * * * *